(12) United States Patent
Nichols

(10) Patent No.: US 8,556,657 B1
(45) Date of Patent: Oct. 15, 2013

(54) ELECTRICAL CONNECTOR HAVING SPLIT FOOTPRINT

(75) Inventor: Robert Paul Nichols, Vacaville, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/480,825

(22) Filed: May 25, 2012

(51) Int. Cl.
*H01R 13/648* (2006.01)

(52) U.S. Cl.
USPC .............................. 439/607.07; 439/607.39

(58) Field of Classification Search
USPC ........................ 439/607.06, 607.07, 607.39
See application file for complete search history.

(56) References Cited

U.S. PATENT DOCUMENTS

| | | | |
|---|---|---|---|
| 5,304,069 A * | 4/1994 | Brunker et al. | 439/108 |
| 5,342,211 A * | 8/1994 | Broeksteeg | 439/108 |
| 6,379,188 B1 * | 4/2002 | Cohen et al. | 439/607.07 |
| 7,607,951 B2 | 10/2009 | Kirk | |
| 7,887,379 B2 * | 2/2011 | Kirk | 439/676 |
| 8,123,563 B2 * | 2/2012 | Kenny et al. | 439/620.22 |
| 2010/0093227 A1 * | 4/2010 | Kirk | 439/676 |

* cited by examiner

*Primary Examiner* — James Harvey

(57) ABSTRACT

An electrical connector includes contact modules each holding a plurality of contacts with dielectric frames surrounding corresponding contacts. The contacts are arranged as differential pairs each having a positive contact and a negative contact. The contacts are arranged along rows and columns with the positive and negative contacts of each pair being in the same row. The contacts are divided into a first group of contacts and a second group of contacts. The contacts within the first group of contacts have a first row pitch and the contacts within the second group of contacts have a second row pitch. A void is provided between the first group of contacts and the second group of contacts having a width at least twice the first row pitch and at least twice the second row pitch.

20 Claims, 8 Drawing Sheets

ELECTRICAL CONNECTOR HAVING SPLIT FOOTPRINT

BACKGROUND OF THE INVENTION

The subject matter herein relates generally to an electrical connector that is configured to be mounted on a circuit board.

Some electrical systems utilize electrical connectors, such as receptacle connectors and header connectors, to interconnect two circuit boards, such as a motherboard and daughtercard. In some systems, to electrically connect the electrical connectors, a midplane circuit board is provided with front and rear header connectors on opposed front and rear sides of the midplane circuit board. Other systems electrically connect the circuit boards without the use of a midplane circuit board by directly connecting electrical connectors on the circuit boards.

The circuit boards associated with the electrical connectors have vias that receive compliant tails of the electrical connectors and signal traces routed from the vias. Due to size constraints of the electrical connectors and the circuit boards, the high density of the electrical connectors and the desire for smaller connector footprints, the signal traces are routed in close proximity to one another and are routed away from the connector footprint in multiple layers of the circuit board. As the density increases, the number of layers needed to route the signal traces from the footprint is increased. Having thicker circuit boards is undesirable and more expensive to manufacture. Additionally, when other components are mounted to the circuit board, the traces associated with each component footprint need to be routed around all other footprints, thereby increasing the overall size of the circuit board.

A need remains for an electrical connector that facilitates routing of signal traces in a circuit board on which the connector is mounted.

BRIEF DESCRIPTION OF THE INVENTION

In one embodiment, an electrical connector is provided having a housing having a mating end configured for mating with another connector and a plurality of contact modules received in the housing. The contact modules each hold a plurality of contacts. The contact modules have dielectric frames surrounding corresponding contacts with the contacts extending from the dielectric frames for electrical termination. The contacts are arranged as differential pairs each having a positive contact and a negative contact. The contacts are arranged in an array along rows and columns with the positive and negative contacts of each pair being in the same row. The array of contacts is divided into a first group of contacts and a second group of contacts. The contacts within the first group of contacts have a first row pitch between each of the contacts within the first group of contacts and the contacts within the second group of contacts have a second row pitch between each of the contacts within the second group of contacts. A void is provided between the first group of contacts and the second group of contacts. The void has a width at least twice the first row pitch and at least twice the second row pitch.

In another embodiment, an electrical connector is provided including a housing having a mating end configured for mating with another connector and a plurality of contact modules received in the housing. The contact modules each hold a plurality of contacts and have dielectric bodies surrounding corresponding contacts. The contacts extend from the dielectric bodies for electrical termination. The contacts are arranged as differential pairs each having a positive contact and a negative contact. The contacts are arranged in an array along rows and columns with the positive and negative contacts of each pair being in the same row. The array of contacts are divided into a transmit group of contacts having at least two differential pairs of the contacts and a receive group of contacts having at least two pairs of the contacts. The receive group of contacts have a first row pitch between each of the contacts within the receive group of contacts. The transmit group of contacts having a second row pitch between each of the contacts within the transmit group of contacts. A void is provided between the transmit group of contacts and the receive group of contacts. The void has a width at least twice the first row pitch and at least twice the second row pitch.

DETAILED DESCRIPTION OF THE INVENTION

Figure 1:
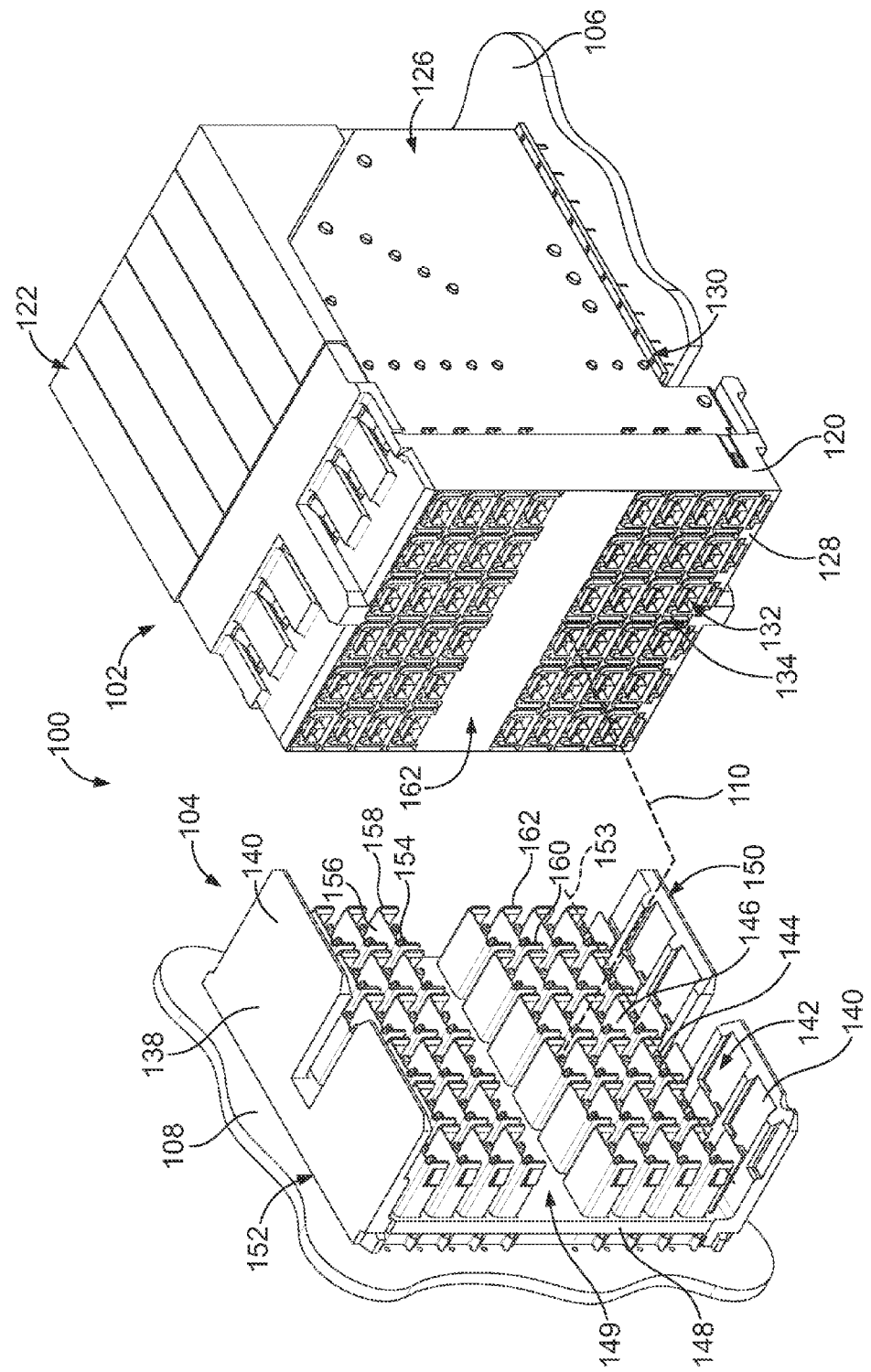
FIG. 1 is a perspective view of an exemplary embodiment of an electrical connector system.

FIG. 1 is a perspective view of an exemplary embodiment of an electrical connector system 100 illustrating a receptacle connector 102 and a header connector 104 that may be directly mated together. The receptacle connector 102 and/or the header connector 104 may be referred to hereinafter individually as a "connector" or collectively as "connectors". The receptacle and header connectors 102, 104 are electrically connected to respective circuit boards 106, 108. The receptacle and header connectors 102, 104 are utilized to electrically connect the circuit boards 106, 108 to one another at a separable mating interface. In an exemplary embodiment, the circuit boards 106, 108 are oriented perpendicular to one another when the receptacle and header connectors 102, 104 are mated. Alternative orientations of the circuit boards 106, 108 are possible in alternative embodiments. Optionally, the header connector 104 or the receptacle connector 102 may be terminated to an end of a cable or cables rather than being board mounted. Optionally, the header connector 104 may be a right angle connector in addition to the receptacle connector 102, or in the alternative to the receptacle connector 102, such as when the receptacle connector 102 is a vertical receptacle connector 102 as opposed to the right angle receptacle connector illustrated in FIG. 1.

A mating axis 110 extends through the receptacle and header connectors 102, 104. The receptacle and header connectors 102, 104 are mated together in a direction parallel to and along the mating axis 110.

The receptacle connector 102 includes a receptacle housing 120 that holds a plurality of contact modules 122. Any number of contact modules 122 may be provided to increase the density of the receptacle connector 102. The contact modules 122 each include a plurality of receptacle signal contacts 124 (shown in FIG. 2) that are received in the receptacle housing 120 for mating with the header connector 104. In an exemplary embodiment, one or more of the contact modules 122 include large gaps between the signal contacts. The large gaps provide additional isolation between the receptacle signal contacts 124. The large gaps change the footprint and/or mating interface of the receptacle connector 102 to meet certain requirements. For example, by providing a large gap at the footprint of the receptacle connector 102, a corresponding space is provided on the circuit board 106 for routing traces to/from the receptacle signal contacts 124. The circuit board 106 may thus be thinner or use fewer layers for routing the traces from the receptacle connector 102. The saved layers of the circuit board 106 can be used to route other traces below the receptacle connector 102.

In an exemplary embodiment, each contact module 122 has a shield structure 126 for providing electrical shielding for the receptacle signal contacts 124. In an exemplary embodiment, the shield structure 126 is electrically connected to the header connector 104 and/or the circuit board 106. For example, the shield structure 126 may be electrically connected to the header connector 104 by extensions (e.g. beams or fingers) extending from the contact modules 122 that engage the header connector 104. The shield structure 126 may be electrically connected to the circuit board 106 by features, such as ground pins.

The receptacle connector 102 includes a mating end 128 and a mounting end 130. The receptacle signal contacts 124 are received in the receptacle housing 120 and held therein at the mating end 128 for mating to the header connector 104. The receptacle signal contacts 124 are arranged in a matrix of rows and columns. In the illustrated embodiment, at the mating end 128, the rows are oriented horizontally and the columns are oriented vertically. Other orientations are possible in alternative embodiments. Any number of receptacle signal contacts 124 may be provided in the rows and columns. The receptacle signal contacts 124 also extend to the mounting end 130 for mounting to the circuit board 106. Optionally, the mounting end 130 may be substantially perpendicular to the mating end 128.

The receptacle housing 120 includes a plurality of signal contact openings 132 and a plurality of ground contact openings 134 at the mating end 128. The receptacle signal contacts 124 are received in corresponding signal contact openings 132. Optionally, a single receptacle signal contact 124 is received in each signal contact opening 132. The signal contact openings 132 may also receive corresponding header signal contacts 144 therein when the receptacle and header connectors 102, 104 are mated. The ground contact openings 134 receive header shields 146 therein when the receptacle and header connectors 102, 104 are mated. The ground contact openings 134 receive grounding projections, such as grounding beams 302, 332 (shown in FIG. 2) of the contact modules 122, which mate with the header shields 146 to electrically common the receptacle and header connectors 102, 104.

The receptacle housing 120 is manufactured from a dielectric material, such as a plastic material, and provides isolation between the signal contact openings 132 and the ground contact openings 134. The receptacle housing 120 isolates the receptacle signal contacts 124 and the header signal contacts 144 from the header shields 146. The receptacle housing 120 isolates each group of receptacle and header signal contacts 124, 144 from other groups of receptacle and header signal contacts 124, 144.

The header connector 104 includes a header housing 138 having walls 140 defining a chamber 142. The header connector 104 has a mating end 150 and a mounting end 152 that is mounted to the circuit board 108. Optionally, the mounting end 152 may be substantially parallel to the mating end 150. The receptacle connector 102 is received in the chamber 142 through the mating end 150. The receptacle housing 120 engages the walls 140 to hold the receptacle connector 102 in the chamber 142. The header signal contacts 144 and the header shields 146 extend from a base wall 148 into the chamber 142. The header signal contacts 144 and the header shields 146 extend through the base wall 148 and are mounted to the circuit board 108.

In an exemplary embodiment, the header signal contacts 144 are arranged as differential pairs. The header signal contacts 144 are arranged in rows along row axes 153. The header shields 146 are positioned between the differential pairs to provide electrical shielding between adjacent differential pairs. In an exemplary embodiment, one or more voids 149 are provided between the header signal contacts 144. The large voids 149 provide isolation between the header signal contacts 144. The voids 149 may extend between rows and/or between columns of one or more of the header signal contacts 144. The large voids change the footprint and/or mating interface of the header connector 104 to meet certain requirements. For example, by providing the voids 149, the footprint of the header connector 104 on the circuit board 108 allows a corresponding space on the circuit board 108 for routing corresponding traces to/from the header signal contacts 144. The circuit board 108 may thus be thinner or have layers that are not used for routing traces for the header connector 104. The saved layers of the circuit board 108 can be used to route other traces behind the header connector 104.

In alternative embodiments, the gap defined by the void 149 may be unnecessary, such as if isolation and/or routing of traces in the circuit board 108 is not crucial or desired. A more traditional header connector (e.g. one without a void) can be used and mated to a receptacle connector having a corresponding mating interface (e.g. one without a void), but that has a void at the mounting footprint to the circuit board 106. In other alternative embodiments, the header connector 104 may not have the void 149 at the mating interface, but the header signal contacts 144 may be routed in such a way that a void is provided at the mounting interface or footprint of the header connector 104.

In the illustrated embodiment, the header shields 146 are C-shaped and provide shielding on three sides of the pair of header signal contacts 144. The header shields 146 have a plurality of walls, such as three planar walls 154, 156, 158. The wall 156 defines a main wall or top wall of the header shields 146. The walls 154, 158 define side walls that extend from the main wall 156. The walls 154, 156, 158 may be integrally formed or alternatively, may be separate pieces. Other configurations or shapes for the header shields 146 are possible in alternative embodiments. More or less walls may be provided in alternative embodiments. The walls may be bent or angled rather than being planar. In other alternative embodiments, the header shields 146 may provide shielding to individual signal contacts 144 or groups of contacts having more than two signal contacts 144.

In the illustrated embodiment, the receptacle connector 102 includes a void 162 that corresponds with the void 149. The void 162 may extend partially or entirely through the receptacle connector 102 between the mating end 128 and the mounting end 130. The void 162 provides separation and/or isolation between receptacle signal contacts 124. Optionally, rather than having the void 162 at the mating interface at the mating end 128, the void between the receptacle signal contacts 124 may be provided at the footprint at the mounting end 130.

Figure 2:
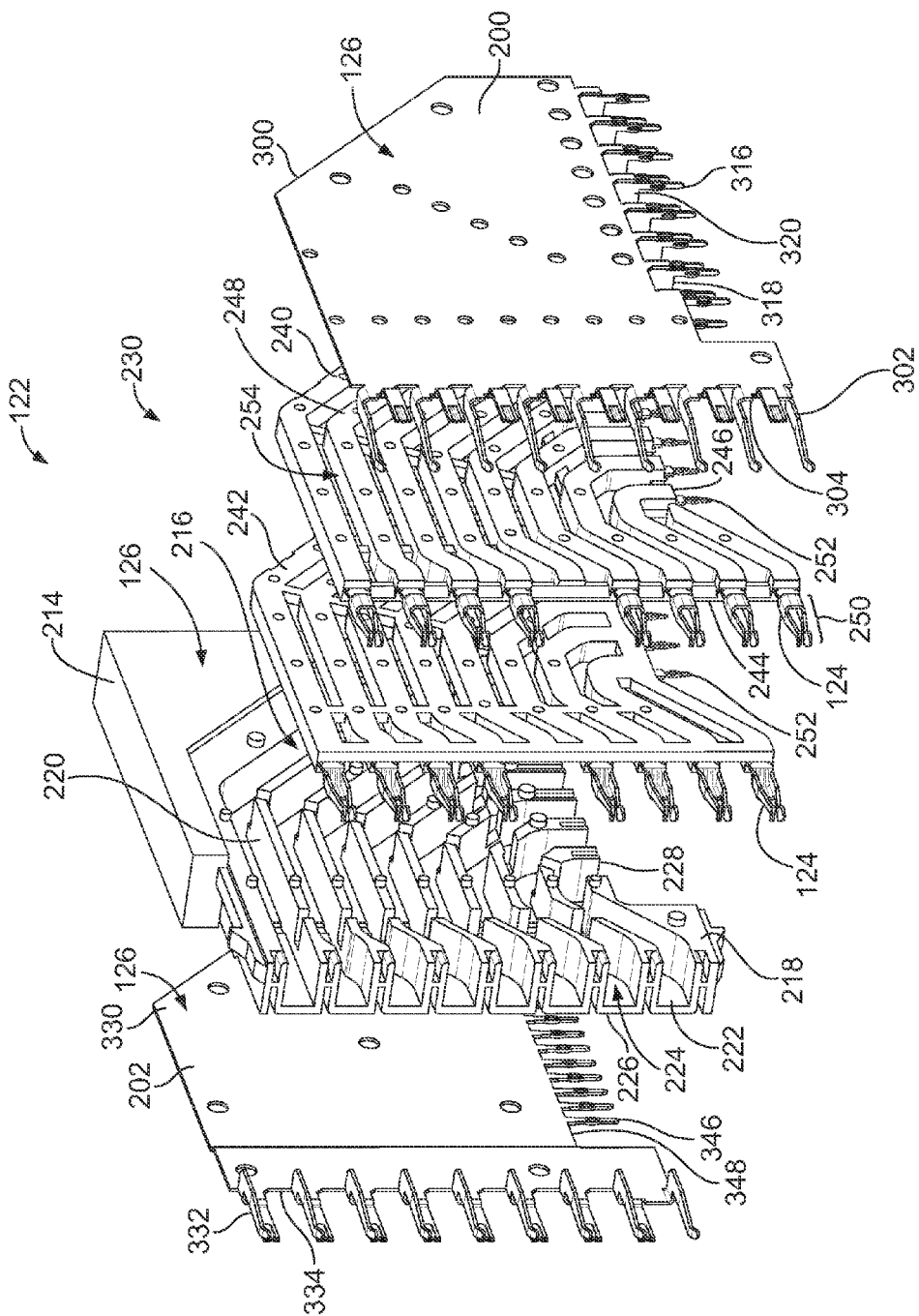
FIG. 2 is an exploded view of a contact module of a receptacle connector of the electrical connector system.

FIG. 2 is an exploded view of one of the contact modules 122 and part of the shield structure 126. The shield structure 126 includes a first ground shield 200 and a second ground shield 202. The first and second ground shields 200, 202 electrically connect the contact module 122 to the header shields 146 (shown in FIG. 1). The first and second ground shields 200, 202 provide multiple, redundant points of contact to the header shield 146. The first and second ground shields 200, 202 provide shielding for the receptacle signal contacts 124.

The contact module 122 includes a conductive holder 214 having a chamber 216 that receives a frame assembly 230. The holder 214 is fabricated from a conductive material. For example, the holder 214 may be die-cast from a metal material. Alternatively, the holder 214 may be stamped and formed or may be fabricated from a plastic material that has been metalized or coated with a metallic layer. By having the holder 214 fabricated from a conductive material, the holder 214 may provide electrical shielding for the receptacle connector 102. The holder 214 defines at least a portion of the shield structure 126 of the receptacle connector 102.

The holder 214 includes tabs 220 extending inward into the chamber 216 from a side wall 222. The tabs 220 parse the chamber 216 into individual channels 224. The tabs 220 define at least a portion of the shield structure 126 of the receptacle connector 102. The holder 214 includes a front 226 and a bottom 228, with the channels 224 extending from the front 226 to the bottom 228.

The frame assembly 230 includes the receptacle signal contacts 124. In an exemplary embodiment, the frame assembly 230 includes a pair of dielectric frames 240, 242 surrounding the receptacle signal contacts 124. Both dielectric frames 240, 242 are loaded into the chamber 216 through an open first side 218 of the holder 214. Alternatively, a single dielectric frame and corresponding receptacle signal contacts 124 are loaded into the holder 214.

In an exemplary embodiment, the receptacle signal contacts 124 are initially held together as lead frames (not shown) which are overmolded with dielectric material to form the dielectric frames 240, 242. Manufacturing processes other than overmolding a lead frame may be utilized to form the contact modules 122, such as loading the receptacle signal contacts 124 into a formed dielectric body.

The dielectric frame 240 includes a mating edge 244 and a mounting edge 246. The dielectric frame 240 includes a plurality of frame members 248. The frame members 248 hold the receptacle signal contacts 124. For example, a different receptacle signal contact 124 extends along, and inside of, a corresponding frame member 248. The frame members 248 encase the receptacle signal contacts 124.

The receptacle signal contacts 124 have mating portions 250 extending from the mating edge 244 and contact tails 252 extending from the mounting edge 246. Other configurations are possible in alternative embodiments. The mating portions 250 and contact tails 252 are the portions of the receptacle signal contacts 124 that extend from the dielectric frame 240 for electrical termination to the header signal contacts 144 and the circuit board 106 (shown in FIG. 1), respectively. In an exemplary embodiment, the mating portions 250 extend generally perpendicular with respect to the contact tails 252. Timer portions or encased portions of the receptacle signal contacts 124 transition between the mating portions 250 and the contact tails 252 within the dielectric frame 240. In the illustrated embodiment, the receptacle signal contacts 124 are right-angle contacts having the mating portions 250 approximately perpendicular to the contact tails 252. When the contact module 122 is assembled, the mating portions 250 extend forward from the front 226 of the holder 214 and the contact tails 252 extend downward from the bottom 228 of the holder 214. Other configurations are possible in alternative embodiments.

The dielectric frame 240 includes a plurality of windows 254 extending through the dielectric frame 240 between the frame members 248. The windows 254 are located between adjacent receptacle signal contacts 124. The windows 254 receive the tabs 220 to provide electrical shielding between corresponding receptacle signal contacts 124.

The dielectric frame 242 is similar to the dielectric frame 240 and includes similar features. During assembly, the dielectric frames 240, 242 are loaded into the chamber 216. The frame members 248 are received in corresponding channels 224. Each of the channels 224 receives two frame members 248, one from each of the dielectric frames 240, 242. The frame members 248 within each channel 224 include a pair of the receptacle signal contacts 124 which are arranged adjacent to each other and define differential pairs of contacts 124. Each channel 224 receives a corresponding differential pair of contacts 124.

The holder 214, which is part of the shield structure 126, provides electrical shielding between and around respective receptacle signal contacts 124. The holder 214 provides shielding from electromagnetic interference (EMI) and/or radio frequency interference (RFI). The holder 214 may provide shielding from other types of interference as well. The holder 214 provides shielding around and between the frames 240, 242, and thus around and between the receptacle signal contacts 124, such as between pairs of receptacle signal contacts 124, to control electrical characteristics, such as impedance control, cross-talk control, and the like, of the receptacle signal contacts 124. The ground shields 200, 202 are used in conjunction with the holder 214 to provide shielding for the receptacle signal contacts 124.

The first ground shield 200 includes a main body 300. The main body 300 is attached to the holder 214 to close off the open side thereof. Alternatively, a second conductive holder may be used to hold the dielectric frame 240 while the holder 214 holds the dielectric frame 242. The second conductive holder may be coupled to the holder 214.

The first ground shield 200 includes projections, such as grounding beams 302, which extend forward from a front 304 of the main body 300. In an exemplary embodiment, the first ground shield 200 is manufactured from a metal material. The first ground shield 200 is a stamped and formed part with the grounding beams 302 being stamped and then bent during the forming process out of plane with respect to the main body 300. Each grounding beam 302 is configured to engage the corresponding header shield 146. The grounding beams 302 are configured to extend forward from the front 226 of the holder 214 such that the grounding beams 302 may be loaded into the receptacle housing 120 (shown in FIG. 1).

The first ground shield 200 includes a plurality of ground pins 316 extending from a bottom 318 of ground tabs 320 that are bent substantially perpendicular from the main body 300. The ground pins 316 are configured to be terminated to the circuit board 106 (shown in FIG. 1). The ground pins 316 may be compliant pins, such as eye-of-the-needle pins, that are through-hole mounted to plated vias in the circuit board 106. Other types of termination means or features may be provided in alternative embodiments to couple the first ground shield 200 to the circuit board 106.

The second ground shield 202 includes a main body 330. The second ground shield 202 includes grounding beams 332 extending forward from a front 334 of the main body 330. The ground shield 202 is a stamped and formed part with the grounding beams 332 being stamped and then bent during the forming process out of plane with respect to the main body 330. Each grounding beam 332 is configured to engage the corresponding header shield 146. The grounding beams 332 are configured to extend forward from the front 226 of the holder 214 such that the grounding beams 332 may be loaded into the receptacle housing 120 (shown in FIG. 1). The second ground shield 202 includes a plurality of ground pins 346 extending from a bottom 348 of the second ground shield 202. The ground pins 346 are configured to be terminated to the circuit board 106 (shown in FIG. 1).

Figure 3:
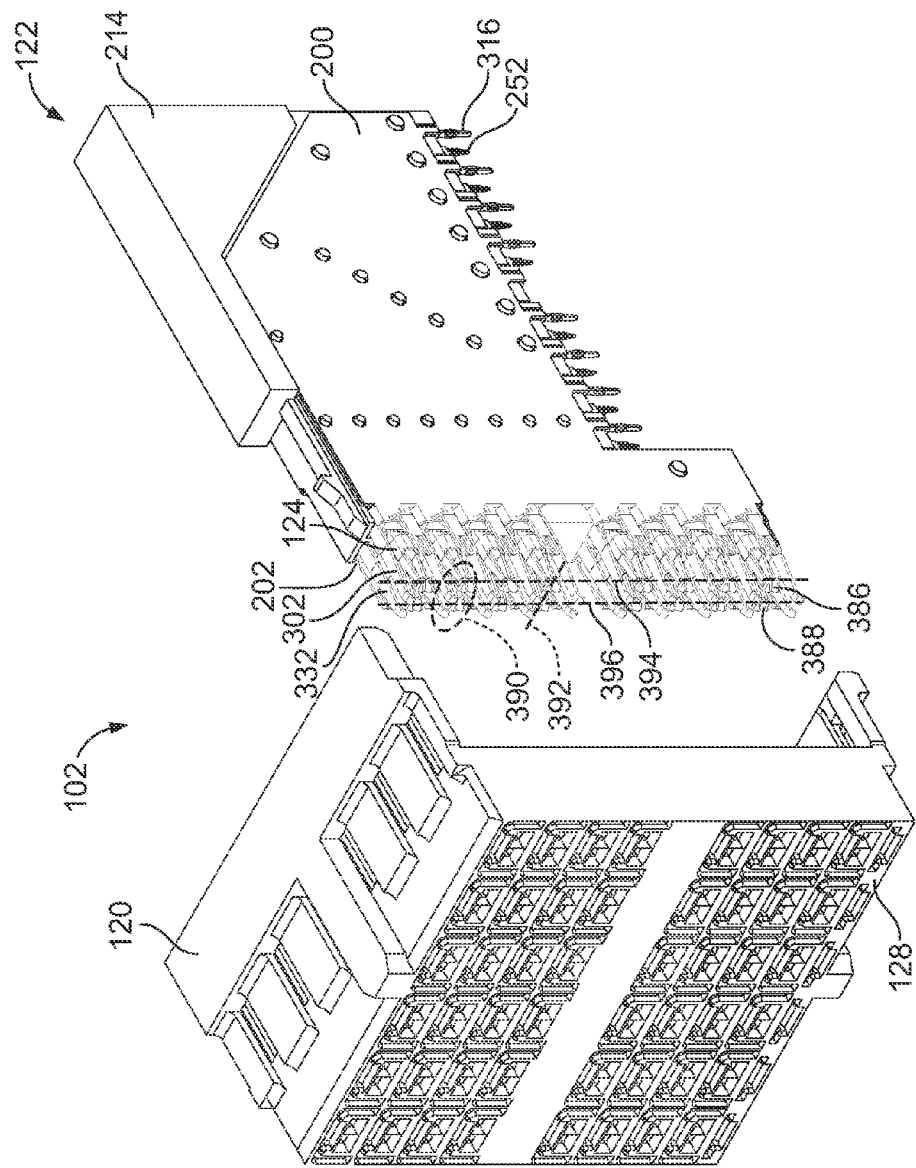
FIG. 3 is an exploded view of the receptacle connector of the electrical connector system.

FIG. 3 is an exploded view of the receptacle connector 102 showing one of the contact modules 122 poised for loading into the receptacle housing 120. Only one contact module 122 is illustrated in FIG. 3, and it is realized that any number of contact modules 122 may be loaded into the receptacle housing 120 during assembly of the receptacle connector 102.

During assembly of the contact module 122, the dielectric frames 240, 242 (shown in FIG. 2) are received in the holder 214. The holder 214 supports and surrounds both dielectric frames 240, 242. The dielectric frames 240, 242 are aligned adjacent one another and may abut against one another. The receptacle signal contacts 124 of both dielectric frames 240, 242 are aligned with one another and define contact pairs 390 with one of the receptacle signal contacts 124 of the pair 390 defining a positive contact 386 and the other receptacle signal contact 124 of the pair 390 defining a negative contact 388. Each contact pair 390 is configured to transmit differential signals through the contact module 122. The receptacle signal contacts 124 within each contact pair 390 are arranged in rows that extend along row axes 392. The receptacle signal contacts 124 within the dielectric frame 240 are arranged within a column along a column axis 394. Similarly, the receptacle signal contacts 124 of the dielectric frame 242 are arranged in a column along a column axis 396. In the illustrated embodiment, at the mating end 128, the rows are oriented horizontally and the columns are oriented vertically, however it is noted that, at the contact tails 252, the columns and thus the column axes 394, 396, are oriented horizontally. Other orientations are possible in alternative embodiments.

The first and second ground shields 200, 202 are coupled to the holder 214 to provide shielding for the receptacle signal contacts 124. The grounding beams 302, 332 are aligned with the contact pairs 390 along the column axis 394 and the column axis 396.

Figure 4:
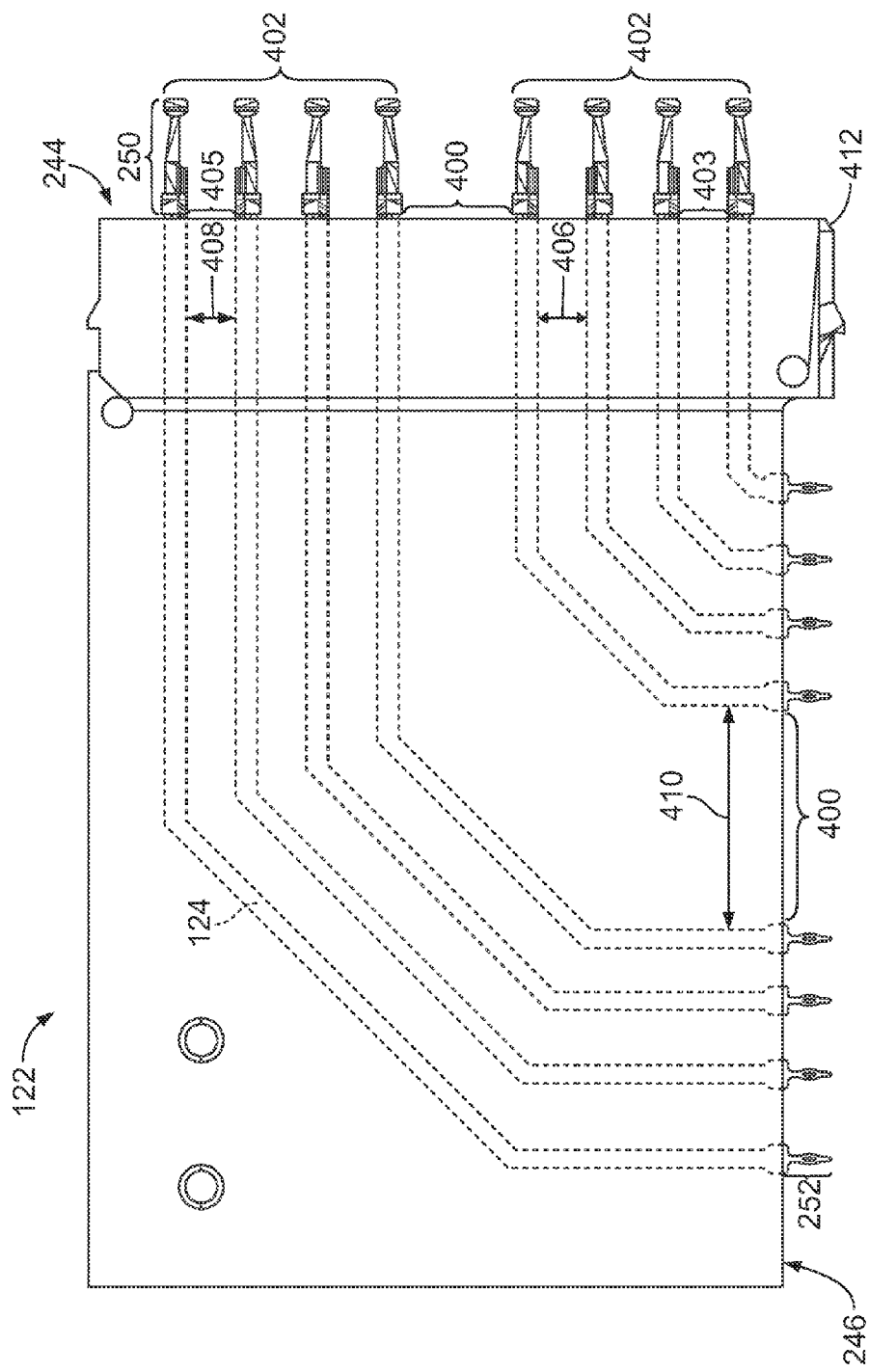
FIG. 4 is a side view of the contact module showing receptacle signal contacts in phantom.

FIG. 4 is a side view of the contact module 122 showing the receptacle signal contacts 124 in phantom. In an exemplary embodiment, the contact module 122 includes a large void 400 between a first group 402 of contacts and a second group 404 of contacts. More than one void 400 may be provided in alternative embodiments. The void 400 provides significant separation between the first and second groups 402, 404 of contacts. The receptacle signal contacts 124 of the first group 402 are separated by gaps 403. The receptacle signal contacts 124 of the second group 404 are separated by gaps 405. The void 400 is wider than the gaps 403 or the gaps 405.

The inter-group separation provided by the void 400 between the receptacle signal contacts 124 of the first and second groups 402, 404 is greater than the intra-group separation between the receptacle signal contacts 124. For example, intra-group spacings 406 are defined by the gaps 403 between the receptacle signal contacts 124 within the first group 402. The intra-group spacings 406 are generally constant and equal, while having some variations to accommodate for routing between the mating portions 250 and the contact tails 252 thereof. The intra-group spacing 406 defines a pitch between the receptacle signal contacts 124. The intra-group spacing 406 may be variable along a length of the receptacle signal contacts 124, such as narrower near the mating portions 250 and wider near the contact tails 252.

Intra-group spacings 408 are defined by the gaps 405 between the receptacle signal contacts 124 within the second group 404. The intra-group spacings 408 are generally constant and equal, while having some variations to accommodate for routing between the mating portions 250 and the contact tails 252 thereof. The intra-group spacing 408 defines a pitch between the receptacle signal contacts 124. The intra-group spacing 408 may be variable along a length of the receptacle signal contacts 124, such as narrower near the mating portions 250 and wider near the contact tails 252.

The inter-group spacing defined by the void 400 has a width 410 that is greater than the spacing 406 of the first group 402 and that is greater than the spacing 408 of the second group 404 (where the distance measurements are from any point along the receptacle signal contacts 124 to the closest point of the adjacent receptacle signal contact 124). In the illustrated embodiment, the width 410 is generally at least twice the spacing 406 and at least twice the spacing 408. The large void 400 provides isolation between the first and second groups 402, 404 of the receptacle signal contacts 124.

In the illustrated embodiment, the contact modules 122 are right angled contact modules, however other types of contact modules may be used in alternative embodiments, such as straight pass-through or vertical contact modules. The mating edge 244 is generally perpendicular to the mounting edge 246. The mating edge 244 defines a front of the contact module 122 and the mounting edge 246 defines a bottom of the contact module 122. The mating and mounting edges 244, 246 generally extend to a corner 412 defined at the bottom-front of the contact module 122. The receptacle signal contacts 124 are radially staggered outward from the corner 412. The receptacle signal contacts 124 have successively greater radial offsets from the corner 412. The first group 402 of contacts is positioned radially inside the second group 404 of contacts. The void 400 is positioned radially between the first group 402 and the second group 404.

Having the receptacle signal contacts 124 radially staggered defines radially inner contacts and radially outer contacts relative to each other. Some of the receptacle signal contacts 124 may define both radially inner contacts and radially outer contacts. For example, with respect to one contact, such receptacle signal contact 124 may be positioned radially outward and with respect to another contact, such receptacle signal contact 124 may be positioned radially inward. The void 400 increases the spacing between the receptacle signal contacts 124 on either side of the void 400 more than the spacing 406 of the radially inner and radially outer contacts within the first group 402 or the spacing 408 of the radially inner and radially outer contacts within the second group 404.

Figure 5:
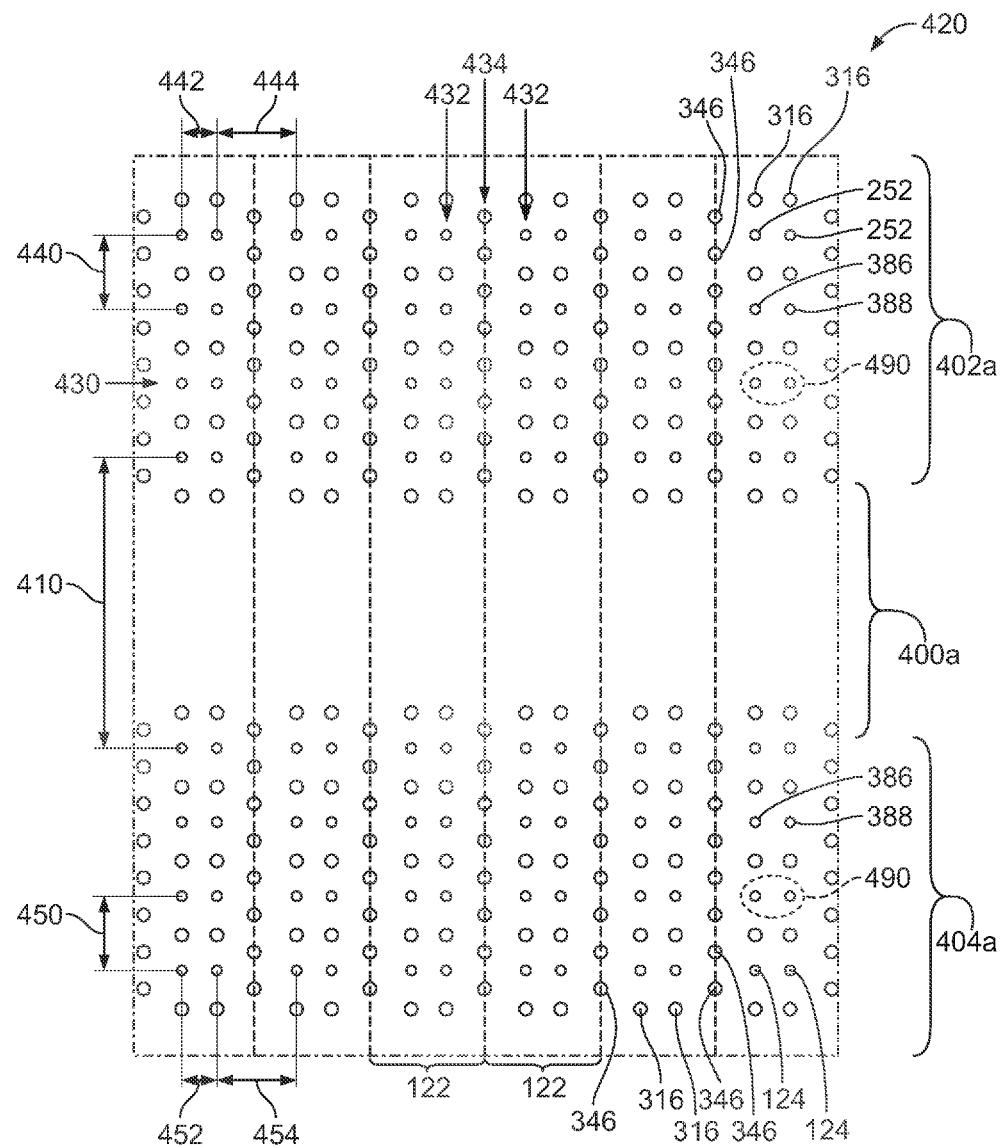
FIG. 5 illustrates a footprint of the receptacle connector in accordance with an exemplary embodiment.

FIG. 5 illustrates a footprint 420 of the receptacle connector 102 in accordance with an exemplary embodiment at the mounting end 130 (shown in FIG. 1) of the receptacle connector 102. The footprint 420 is defined by the layout of the signal contact tails 252, the ground pins 316 and the ground pins 346. The signal contact tails 252 are arranged in differential pairs 490. A first group 402a of signal contact tails 252 is separated from a second group 404a of signal contact tails by a void 400a. The void 400a isolates the signal contact tails 252 of the first group 402a from the second group 404a. Optionally, the signal contact tails 252 of the first group 402a are all associated with transmit contacts while the signal contact tails 252 of the second group 404a are all associated with receive contacts, or vice versa. In other embodiments, the signal contact tails 252 of the first group 402a are all associated with high speed contacts while the signal contact tails 252 of the second group 404a are all associated with non-high speed contacts, or vice versa. In other embodiments, the first group 402a of signal contact tails 252 are all associated with data contacts while the second group 404a of signal contact tails 252 are associated with other types of contacts, such as power contacts, or vice versa. In the illustrated embodiment, the number of signal contact tails of the first group 402s is approximately equal to the number of signal contact tails of the second group 404a, however the groups 402a, 404a may have different numbers of signal contact tails in alternative embodiments. More than two groups of signal contact tails may be provided in alternative embodiments, each being separated by different voids. The voids may extend laterally, longitudinally or in other transverse directions.

The signal contact tails 252 are arranged in an array along rows 430 and columns 432. The positive contacts 386 and the negative contacts 388 of each pair 490 are in the same row 430. In an exemplary embodiment, for each contact module 122, the positive contacts 386 are all held by the dielectric frame 240 (shown in FIG. 2) while the negative contacts 388 are all held by the dielectric frame 242 (shown in FIG. 2). The positive contacts 386 are all arranged in a same column 432 and the negative contacts are all arranged in a different same column 432.

The ground pins 316, 346 surround each pair 490. The ground pins 316 are aligned in-column with the signal contact tails 252. The ground pins 346 are aligned in a column 434 off-set from the columns 432 of signal contact tails 252.

In an exemplary embodiment, the signal contact tails 252 of the first group 402a have a first row pitch 440 between pairs 490 within each contact module 122, wherein pitch is defined as a dimension between indicated centerlines. In the illustrated embodiment, the first row pitch 440 is the same for each pair 490, however the first row pitch 440 may be different for different contact modules 122 or may be different for the pairs 490 within a contact module 122. The signal contact tails 252 of the first group 402a have an intra-column pitch 442 between the positive contact 386 and the negative contact 388 within each pair 490. In the illustrated embodiment, the intra-column pitch 442 is the same for each pair 490, however the intra-column pitch 442 may be different for different contact modules 122. The signal contact tails 252 of the first group 402a have an inter-column pitch 444 between the pairs 490 measured between the positive contact 386 of one contact module 122 and the negative contact 388 of the adjacent contact module 122. In the illustrated embodiment, the inter-column pitch 444 is the same between each of the pairs 490, however the inter-column pitch 444 may be different between different contact modules 122.

In an exemplary embodiment, the signal contact tails 252 of the second group 404a have a second row pitch 450 between pairs 490 within each contact module 122. In the illustrated embodiment, the second row pitch 450 is the same for each pair 490, however the second row pitch 450 may be different for different contact modules 122 or may be different for the pairs 490 within a contact module 122. The signal contact pairs of the second group 404a have an intra-column pitch 452 between the positive contact 386 and the negative contact 388 within each pair 490. In the illustrated embodiment, the intra-column pitch 452 is the same for each pair 490, however the intra-column pitch 452 may be different for different contact modules 122. The signal contact tails 252 of the second group 404a have an inter-column pitch 454 between the pairs 490 measured between the positive contact 386 of one contact module 122 and the negative contact 388 of the adjacent contact module 122. In the illustrated embodiment, the inter-column pitch 454 is the same between each of the pairs 490, however the inter-column pitch 454 may be different between different contact modules 122.

Optionally, the row pitches 440, 450 may be the same. Optionally, the intra-column pitches 442, 452 may be the same. Optionally, the inter-column pitches 444, 454 may be the same.

The void 400a separates the first and second groups 402a, 404a. The void 400 separates at least one differential pair 490 from at least one other differential pair 490 within the same contact module 122, and thus within the same column 432. The void 400a is elongated along the rows 430 and extends across at least two columns, such as at least one column 432 of positive contacts 386 and at least one column 432 of negative contacts 388. In the illustrated embodiment, the void 400a spans across each of the contact modules 122 and thus across each of the columns 432. The width 410a of the void 400a is at least twice the first row pitch 440 and is at least twice the second row pitch 450.

The electrical performance of the receptacle connector 102 is enhanced by having the void 400a separate the first and second groups 402a, 404a of signal contact tails, such as by reducing cross-talk between the contacts of the first and second groups 402, 404. Additionally, the circuit board 106 (shown in FIG. 1) has a similar footprint to receive the receptacle connector 102. Having a similar void on the circuit board 106 provides space for the traces of the circuit board 106 to be routed from under the footprint.

Figure 6:
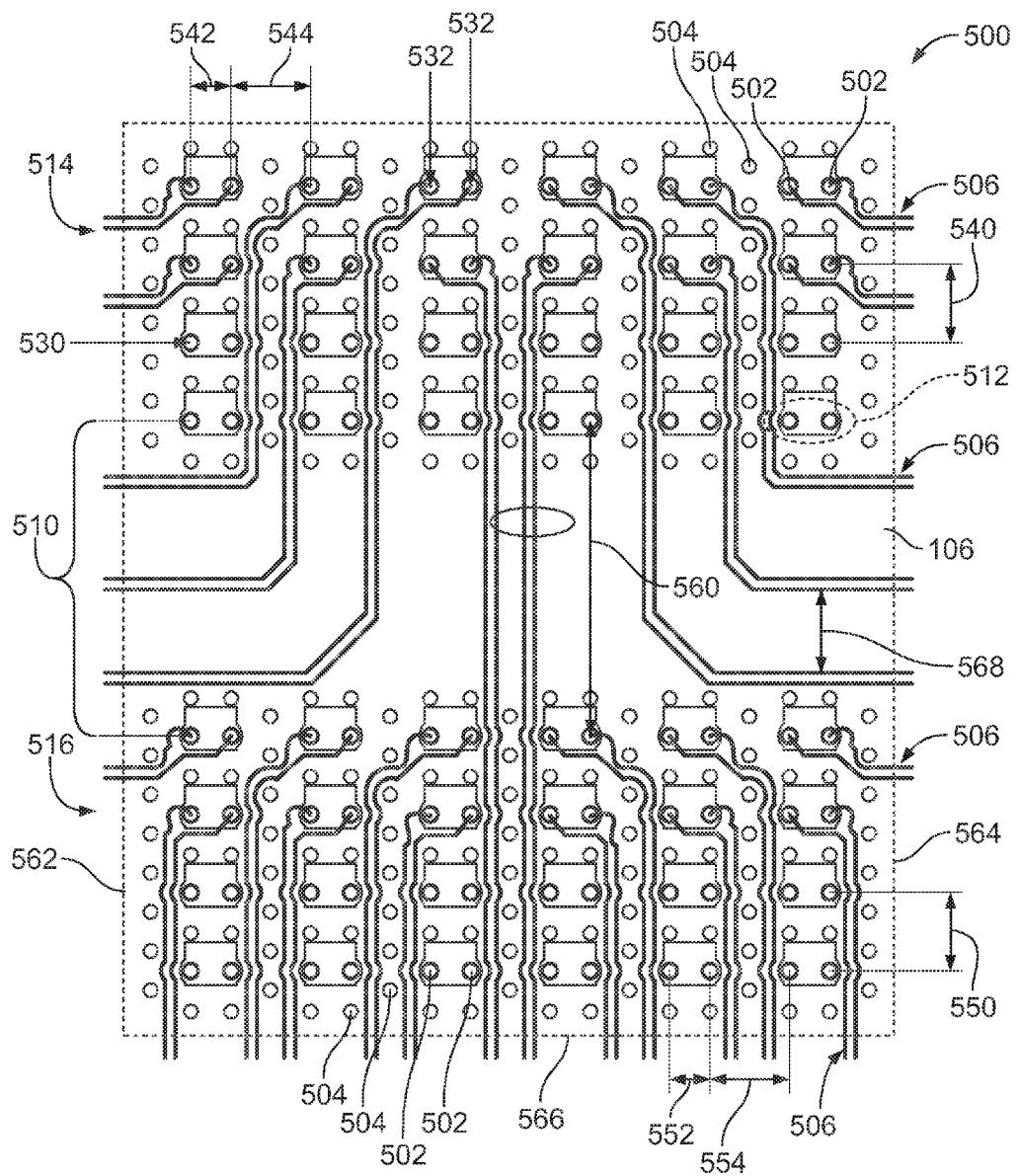
FIG. 6 illustrates a circuit board showing a footprint of signal vias and ground vias that corresponds to the layout of the receptacle signal contacts.
Figure 7:
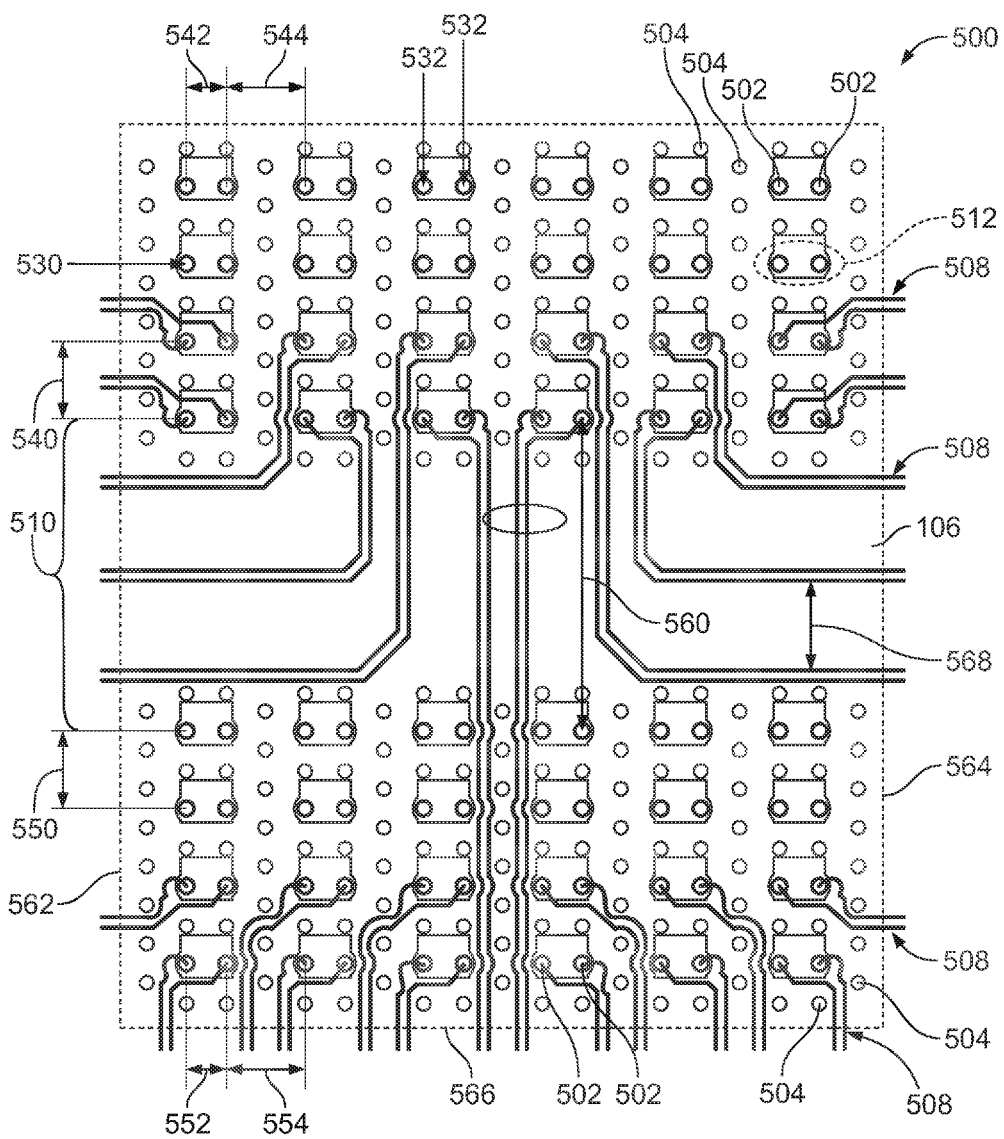
FIG. 7 illustrates the circuit board showing the footprint.

FIG. 6 illustrates the circuit board 106, showing a footprint 500 of signal vias 502 and ground vias 504 that corresponds to the layout of the receptacle signal contacts 124, the ground pins 316 and the ground pins 346 (all shown in FIG. 2), FIG. 6 also illustrates a first group of signal traces 506 routed through the footprint on the circuit board 106. FIG. 7 illustrates the circuit board 106 showing the footprint 500 and also illustrates a second group of signal traces 508 routed through the footprint on the circuit board 106. FIGS. 6 and 7 show an embodiment where the signal traces from all of the signal vias 502 are routed out from under the receptacle connector 102 on two layers. Other layers of the circuit board 106 may be used for routing traces from other components, which may allow for a reduction in the overall size of the circuit board 106.

The signal vias 502 are arranged in differential pairs 512. A first group 514 of signal vias 502 is separated from a second group 516 of signal vias 502 by a void 510. The void 510 isolates the first and second groups 514, 516 of signal vias 502. Optionally, the first group 514 of signal vias 502 may convey all transmit signals while the second group 516 of signal vias 502 convey all receive signals, or vice versa. In the illustrated embodiment, the number of signal vias 502 of the first group 514 is approximately equal to the number of signal vias 502 of the second group 516, however the groups 514, 516 may have different numbers of signal vias 502 in alternative embodiments. More than two groups of signal vias 502 may be provided in alternative embodiments, each being separated by different voids. The voids may extend laterally, longitudinally or in other transverse directions.

The signal vias 502 are arranged in an array along rows 530 and columns 532. The ground vias 504 surround each pair 512. The signal vias 502 of each pair 512 are in the same row 530. In an exemplary embodiment, the signal vias 502 of the first group 514 have a first row pitch 540 between pairs 512. The signal vias 502 of the first group 514 have an intra-column pitch 542 between the signal vias 502 within each pair 512. The signal vias 502 of the first group 514 have an inter-column pitch 544 between the pairs 512. The signal vias 502 of the second group 516 have a second row pitch 550 between pairs 512. The signal vias 502 of the second group 516 have an intra-column pitch 552 between the signal vias 502 within each pair 512. The signal vias 502 of the second group 516 have an inter-column pitch 554 between the pairs 512. Optionally, the row pitches 540, 550 may be the same. Optionally, the intra-column pitches 542, 552 may be the same. Optionally, the inter-column pitches 544, 554 may be the same.

The void 510 separates the first and second groups 514, 516 of signal vias 502. The void 510 is elongated along the rows 530 and extends across at least two columns 532 of signal vias 502. In the illustrated embodiment, the void 510 spans across each of the columns 532 of signal vias 502. A width 560 of the void 510 is at least twice the first row pitch 540 and is at least twice the second row pitch 550. The void 510 provides an area for routing the signal traces 506, 508. For example, the signal traces 506, 508 may be routed outward from under the receptacle connector 102 to a first side 562 and to a second side 564 as well as to a rear side 566 (represented schematically in FIGS. 6 and 7) of the receptacle connector 102. In the illustrated embodiment, only signal traces 506 from the first group 514 of signal vias 502 are routed out at the void 510, however signal traces 508 from the second group 516 could similarly be routed out at the void 510. Signal traces 506 from interior pairs 512 (e.g. pairs 512 that are not immediately adjacent the first side 562 or the second side 564) are routed out to the sides 562, 564 at the void 510. The void 510 is sufficiently wide to maintain adequate spacing 568 between pairs of signal traces 506.

The electrical performance of the system is enhanced by having the void 510 separate the first and second groups 514, 516 of signal vias 502, such as by providing more space to route the signal traces 506 and/or 508, thereby reducing cross-talk between the signal vias 502. Additionally, fewer layers of the circuit board 106 are needed to route all of the signal traces 506, 508 from under the footprint of the receptacle connector 102. Having the void 510 provides space for other traces of the circuit board 106 to be routed under the footprint, such as on other layers of the circuit board 106.

Figure 8:
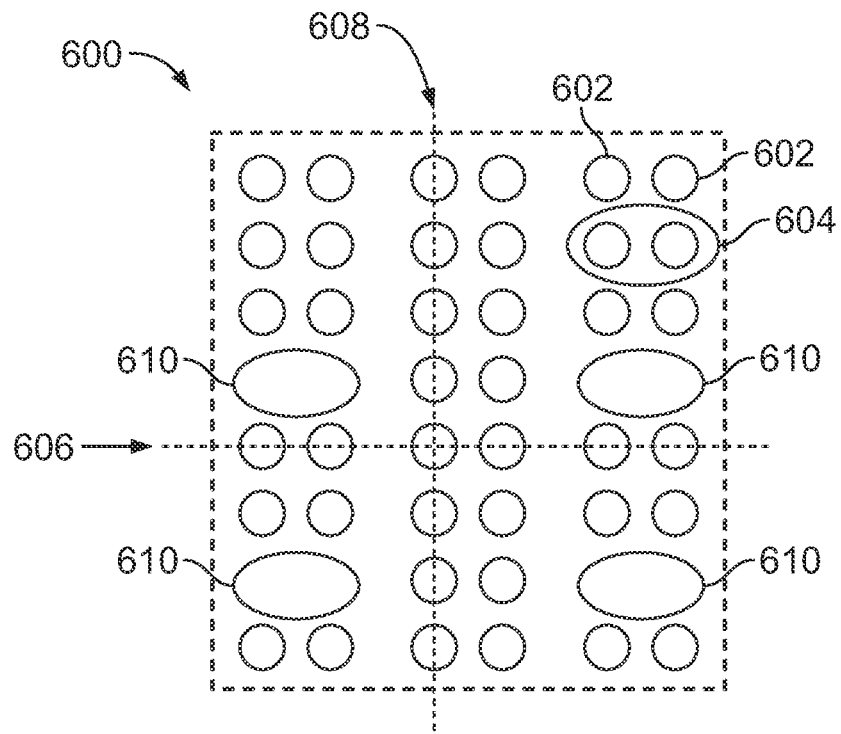
FIG. 8 illustrates another footprint.

FIG. 8 illustrates an alternative footprint 600 having signal conductors 602 arranged in pairs 604. The footprint 600 may be a footprint of a connector assembly or a circuit board. The signal conductors 602 may be contacts, vias or other types of conductors. The footprint 600 does not illustrate ground conductors, but such conductors may be arranged in any pattern around individual signal conductors 602, pairs of signal conductors 602 or sets of signal conductors 602. The signal conductors 602 are arranged in rows 606 and columns 608. The signal conductors of each pair 604 are aligned in corresponding rows 606.

The footprint 600 includes voids 610 arranged between corresponding signal conductors 602. The voids 610 provide areas of separation between pairs 604 of signal conductors 602. The voids 610 provide spaces for signal traces of a corresponding circuit board to be routed.

Figure 9:
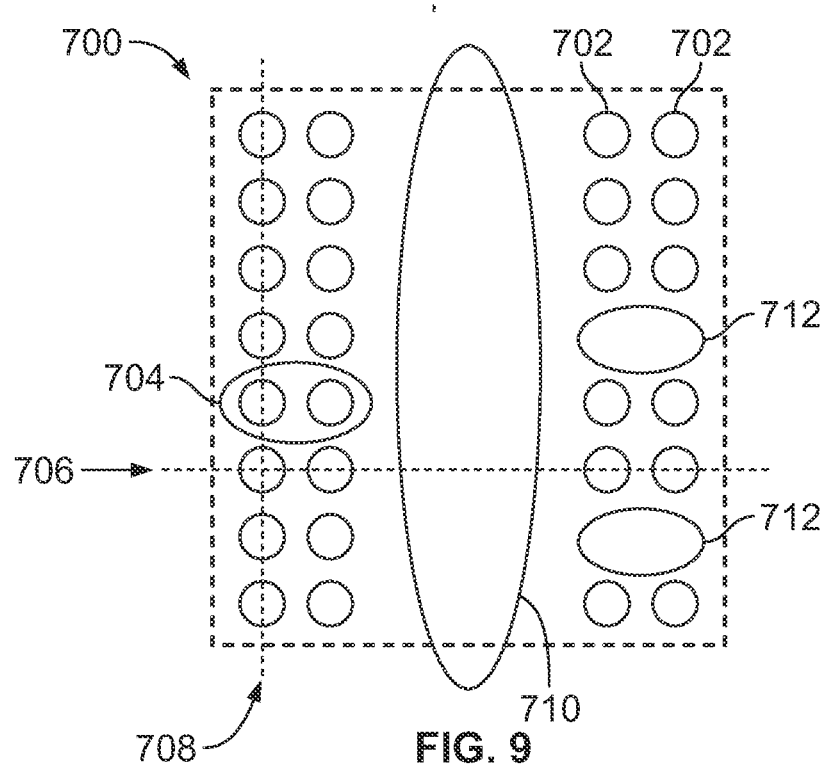
FIG. 9 illustrates another footprint.

FIG. 9 illustrates an alternative footprint 700 having signal conductors 702 arranged in pairs 704. The footprint 700 may be a footprint of a connector assembly or a circuit board. The signal conductors 702 may be contacts, vias or other types of conductors. The footprint 700 does not illustrate ground conductors, but such conductors may be arranged in any pattern around individual signal conductors 702, pairs of signal conductors 702 or sets of signal conductors 702. The signal conductors 702 are arranged in rows 706 and columns 708. The signal conductors of each pair 704 are aligned in corresponding rows 706.

The footprint 700 includes a column void 710 arranged between columns of signal conductors 702. The column void 710 provides an area of separation between columns of signal conductors 702. The column void 710 provides a space for signal traces of a corresponding circuit board to be routed. The column void 710 is elongated along the columns 708 and spans at least two rows 706. In the illustrated embodiment, the column void 710 spans all of the rows 706.

The footprint 700 includes row voids 712 arranged between corresponding rows of signal conductors 702. The row voids 712 provide areas of separation between pairs 704 of signal conductors 702. The row voids 712 provide spaces for signal traces of a corresponding circuit board to be routed. The row voids 712 are elongated along the rows 706 and span at least two columns 708. The row voids 712 separate at least one differential pair 704 of conductors 702 from at least one other differential pair 704 of conductors 702 within the same corresponding columns 708.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector comprising:
   a housing having a mating end configured for mating with another connector; and
   a plurality of contact modules received in the housing, the contact modules each holding a plurality of contacts, the contact modules having dielectric frames surrounding corresponding contacts, the contacts extending from the dielectric frames for electrical termination;
   wherein the contacts are arranged as differential pairs each having a positive contact and a negative contact;
   wherein the contacts are arranged in an array along rows and columns, the positive and negative contacts of each pair being in the same row;
   wherein the array of contacts are divided into a first group of contacts and a second group of contacts, the contacts within the first group of contacts having a first row pitch between each of the contacts within the first group of contacts, the contacts within the second group of contacts having a second row pitch between each of the contacts within the second group of contacts;

wherein a void is provided between the first group of contacts and the second group of contacts, the void having a width at least twice the first row pitch and at least twice the second row pitch.

2. The electrical connector of claim 1, wherein at least one of the contacts of the first group of contacts and at least one of the contacts of the second group of contacts are held by the same contact module.

3. The electrical connector of claim 1, wherein the void is elongated along the rows and extends across at least two columns.

4. The electrical connector of claim 1, wherein the void separates at least one differential pair of contacts from at least one other differential pair of contacts within the same corresponding columns.

5. The electrical connector of claim 1, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of each contact module being radially staggered having successively greater radial offsets from the corner, the void being positioned between two of the radially staggered contacts such that the spacing between such contacts is greater than the spacing between any other two contacts of the contact module.

6. The electrical connector of claim 1, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of the contact module defining radially inner contacts and radially outer contacts relative to each other, the void increasing the spacing between nearest radially inner and radially outer contacts more than other radially inner and radially outer contacts.

7. The electrical connector of claim 1, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of the contact module being radially offset from the corner with the first group of contacts being positioned radially inside the second group of contacts, the contacts of the first group of contacts being separated by gaps having generally uniform widths, the contacts of the second group of contacts being separated by gaps having generally uniform widths, the width of the void being at least twice the width of the gaps of the first group of contacts, the widths of the void being at least twice the width of the gaps of the second group of contacts.

8. The electrical connector of claim 1, wherein the void spans each of the contact modules.

9. The electrical connector of claim 1, wherein void spans less than all of the contact modules.

10. The electrical connector of claim 1, wherein the contact modules have conductive holders each holding a pair of dielectric frames and corresponding contacts, the positive contact of each differential pair being held by one of the dielectric frames and the negative contact of each differential pair being held by the other dielectric frame, the conductive holder surrounding the dielectric bodies and providing electrical shielding for the contacts of the contact module from contacts of an adjacent contact module, the void separating at least one differential pair from at least one other differential pair of the contact module.

11. An electrical connector comprising:
a housing having a mating end configured for mating with another connector; and
a plurality of contact modules received in the housing, the contact modules each holding a plurality of contacts, the contact modules having dielectric bodies surrounding corresponding contacts, the contacts extending from the dielectric bodies for electrical termination;
wherein the contacts are arranged as differential pairs each having a positive contact and a negative contact;
wherein the contacts are arranged in an array along rows and columns, the positive and negative contacts of each pair being in the same row;
wherein the array of contacts are divided into a transmit group of contacts comprising at least two differential pairs of the contacts and a receive group of contacts comprising at least two pairs of the contacts, the receive group of contacts having a first row pitch between each of the contacts within the receive group of contacts, the transmit group of contacts having a second row pitch between each of the contacts within the transmit group of contacts;
wherein a void is provided between the transmit group of contacts and the receive group of contacts, the void having a width at least twice the first row pitch and at least twice the second row pitch.

12. The electrical connector of claim 11, wherein at least one of the contacts of the first group of contacts and at least one of the contacts of the second group of contacts are held by the same contact module.

13. The electrical connector of claim 11, wherein the void is elongated along the rows and extends across at least two columns.

14. The electrical connector of claim 11, wherein the void separates at least one differential pair of contacts from at least one other differential pair of contacts within the same corresponding columns.

15. The electrical connector of claim 11, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of each contact module being radially staggered having successively greater radial offsets from the corner, the void being positioned between two of the radially staggered contacts such that the spacing between such contacts is greater than the spacing between any other two contacts of the contact module.

16. The electrical connector of claim 11, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of the contact module defining radially inner contacts and radially outer contacts relative to each other, the void increasing the spacing between nearest radially inner and radially outer contacts more than other radially inner and radially outer contacts.

17. The electrical connector of claim 11, wherein the contact modules are right angled contact modules each having the contacts extending from a mating edge of the dielectric frames and extending from a mounting edge of the dielectric frames, the mating edge being generally perpendicular to the mounting edge, the contact module having a corner, the contacts of the contact module being radially offset from the corner with the first group of contacts being positioned radially inside the second group of contacts, the contacts of the first group of contacts being separated by gaps having generally uniform widths, the contacts of the second group of contacts being separated by gaps having generally uniform widths, the width of the void being at least twice the width of the gaps of the first group of contacts, the widths of the void being at least twice the width of the gaps of the second group of contacts.

18. The electrical connector of claim 11, wherein the void spans each of the contact modules.

19. The electrical connector of claim 11, wherein void spans less than all of the contact modules.

20. The electrical connector of claim 11, wherein the contact modules have conductive holders each holding a pair of dielectric frames and corresponding contacts, the positive contact of each differential pair being held by one of the dielectric frames and the negative contact of each differential pair being held by the other dielectric frame, the conductive holder surrounding the dielectric bodies and providing electrical shielding for the contacts of the contact module from contacts of an adjacent contact module, the void separating at least one differential pair from at least one other differential pair of the contact module.

\* \* \* \* \*